(12) United States Patent
Higashikozono et al.

(10) Patent No.: US 7,369,398 B2
(45) Date of Patent: May 6, 2008

(54) TERMINAL BOX AND A METHOD OF PROVIDING IT

(75) Inventors: Makoto Higashikozono, Yokkaichi (JP); Hiroyuki Yoshikawa, Yokkaichi (JP); Kazuki Naito, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 310 days.

(21) Appl. No.: 11/194,413

(22) Filed: Aug. 1, 2005

(65) Prior Publication Data
US 2006/0049802 A1   Mar. 9, 2006

(30) Foreign Application Priority Data
Aug. 19, 2004  (JP) ............... 2004-239720

(51) Int. Cl.
*H05K 7/20* (2006.01)
*H01R 12/00* (2006.01)

(52) U.S. Cl. ............ 361/641; 361/704; 361/710; 257/719; 439/76.2

(58) Field of Classification Search ............. 361/641
See application file for complete search history.

(56) References Cited

U.S. PATENT DOCUMENTS

| | | | |
|---|---|---|---|
| 4,460,232 A | | 7/1984 | Sotolongo |
| 4,899,256 A | * | 2/1990 | Sway-Tin ............... 361/715 |
| 4,972,295 A | * | 11/1990 | Suguro et al. ............ 361/706 |
| 5,140,500 A | * | 8/1992 | Klein et al. ............. 361/707 |
| 5,761,038 A | * | 6/1998 | Tanaka .................. 361/700 |
| 6,434,005 B1 | * | 8/2002 | Vinciarelli et al. ....... 361/704 |
| 6,494,723 B2 | * | 12/2002 | Yamane et al. .......... 439/76.2 |
| 6,655,987 B2 | | 12/2003 | Higashikozono et al. |
| 6,671,173 B2 | * | 12/2003 | Ashiya et al. ........... 361/704 |
| 6,785,139 B2 | * | 8/2004 | Onizuka et al. .......... 361/704 |
| 6,948,950 B2 | * | 9/2005 | Yamaguchi ............. 439/76.2 |
| 7,002,813 B2 | | 2/2006 | Bergmann et al. |

FOREIGN PATENT DOCUMENTS

| | | |
|---|---|---|
| JP | 11-26035 | 1/1999 |
| JP | 2001-119058 A | 4/2001 |
| JP | 2001-298134 | 10/2001 |
| JP | 2002-359389 A | 12/2002 |
| JP | 2003-347573 | 5/2003 |

* cited by examiner

*Primary Examiner*—Gregory D Thompson
(74) *Attorney, Agent, or Firm*—Gerald E. Hespos; Anthony J. Casella

(57) ABSTRACT

Terminal plates (30) are juxtaposed on a base plate (11) for electrically connecting positive and negative electrodes of a solar battery module (90) to cables (80) for external connection. A rectifying device (50) spans between adjacent terminal plates (30). Each rectifying device (50) has a bypass diode (52) and a metal clip (53) resiliently holds the bypass diode (52). A heat discharging sheet (40) is attached to the lower surface of the clip (53) for discharging heat generated by the bypass diode (52). Heat discharged from a heat discharging surface (40A) of the heat discharging sheet (40) is received by a heat receiving surface (90A) of the solar battery module (90) via a through hole (11B) formed in the base plate (11) and is discharged efficiently from the solar battery module (90).

10 Claims, 3 Drawing Sheets

TERMINAL BOX AND A METHOD OF PROVIDING IT

BACKGROUND OF THE INVENTION

1. Field of the Invention

The invention relates to a terminal box for an electric or electronic device such as a solar battery module and to a method of providing it.

2. Description of the Related Art

A solar energy generation system supplies direct-current electricity from a solar battery panel on the roof of a house to electric equipment via an inverter or the like. The solar battery panel has a plurality of solar battery modules, and electrodes of the solar battery modules are connected in series or in parallel via terminal boxes.

Japanese Unexamined Patent Publication No. H11-26035 discloses a terminal box that has two terminal plates juxtaposed on a base plate. Ends of the terminal plates at one side are connected with positive and negative electrodes drawn out from the underside of the solar battery module. The other ends of the terminal plates are connected with cables for external connection. A bypass diode spans between the two terminal plates. The bypass diode shorts an inverse current when there is an inverse load from one cable for external connection to the other. A lead wire of the bypass diode is soldered to the corresponding terminal plate for electrically connection and is placed fixedly on the base plate via a mounting pin that projects from the base plate.

Heat generated in the bypass diode of the above-described terminal box is likely to remain in the bypass diode without being smoothly discharged. Thus, the diode function can be impaired by excessive temperature increase.

The present invention was developed in view of the above problem and an object thereof is to improve heat discharging characteristics.

SUMMARY OF THE INVENTION

The invention relates to a terminal box for an electric or electronic device, such as a solar battery module. The terminal box has a plurality of terminal plates arranged on a base plate and electrically connecting the positive and negative electrodes of the electric or electronic device. At least one rectifying device spans between the two terminal plates for bypass when there is an inverse load. At least one heat discharging element is attached to the rectifying device for discharging heat generated by the rectifying device.

The heat discharging element preferably comprises a heat discharging sheet that is attachable to the rectifying device. The heat discharging sheet may be formed by applying to the rectifying device an adhesive that has a high heat discharging property.

A heat receiving surface preferably is spaced from the heat discharging surface of the heat discharging element.

The heat receiving surface preferably is on the underside of the solar battery module. The heat discharging surface of the heat discharging element is located to correspond to a through hole in the base plate and is substantially opposed to the heat receiving surface through the through hole.

Heat generated by the rectifying device is transferred from the heat discharging surface of the heat discharging element, through the through hole in the base plate and to the heat receiving surface on the underside of the solar battery module. Thus, heat is discharged efficiently from the solar battery module.

A substantially transparent resin layer preferably is provided between the heat discharging surface and the heat receiving surface.

Partition walls preferably are formed on the base plate to extend substantially edges of the terminal plates and/or cables for the connection of the terminal plates with the electric or electronic module.

An insulating resin preferably is filled at least partly into an adjacent space defined by the partition walls, and at least partly onto the terminal plates and/or the cables inside the partition walls.

A clip with at least two supporting pieces preferably is provided for mounting the rectifying device on the base plate.

The heat discharging element preferably is attached to an arranging surface of a first supporting piece arranged on or close to the base plate.

The arranging surface of the first supporting piece preferably is adjacent to a heat discharging plate of the rectifying device.

A second support with a divergent leading end may be provided to guide the rectifying device into engagement with the clip.

The clip preferably comprises a stopper for limiting relative movement of the rectifying device.

The invention also relates to a method of assembling a terminal box with an electric or electronic device, such as a solar battery module. The method comprises providing terminal plates for electrically connecting positive and negative electrodes of the electric or electronic device. The method then comprises arranging the terminal plates on a base plate, spanning at least one rectifying device between two corresponding terminal plates for bypass during an inverse load. The method further includes attaching at least one heat discharging element to the rectifying device for discharging heat generated by the rectifying device.

The method may further include positioning a heat receiving surface at a distance from the heat discharging surface of the heat discharging element for receiving heat discharged from the heat discharging element. The heat receiving surface preferably is on the underside of the electric or electronic device.

The method also may include providing a resin layer, preferably a substantially transparent resin layer between the heat discharging surface and the heat receiving surface.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
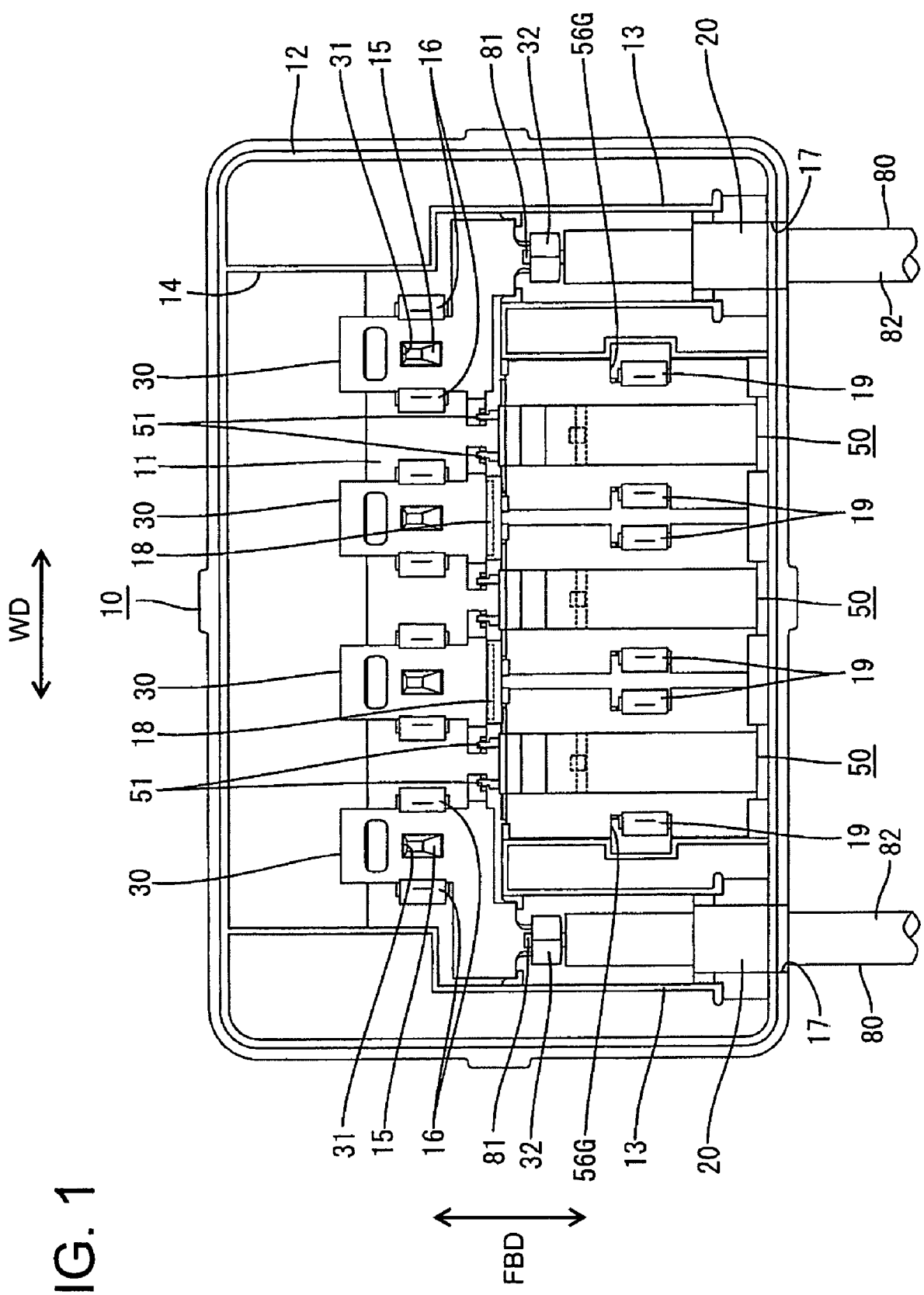
FIG. 1 is a plan view showing an internal construction of a box main body according to a first embodiment of the invention.

A terminal box according to the invention is mountable on the underside of a solar battery module 90. Solar battery cells are connected in series and are arranged on the outer surface of the solar battery module 90. The terminal box is comprised of a box main body 10, a plurality of juxtaposed terminal plates 30 in the box main body 10, and rectifying-device units 50 spanning between adjacent terminal plates 30. In the following description, a side where no cables 80 exit the box main body 10 is referred to as the front side concerning forward and backward directions FBD.

Figure 3:
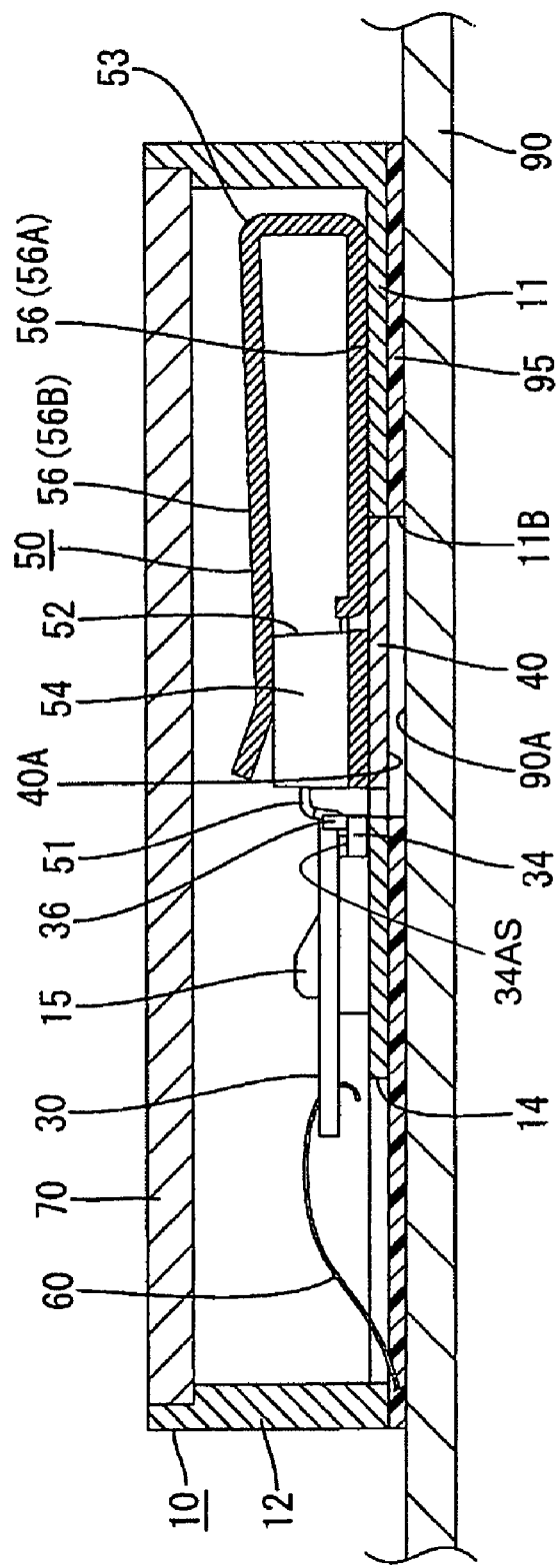
FIG. 3 is a section showing the box main body closed by a cover and mounted on a solar battery module.

The box main body 10 is made e.g. of a synthetic resin and defines a substantially box shape with an open top. An insulating resin is filled at least partly into the inside of the box main body 10 and a cover 70 is mounted on the top. The box main body 10 has a substantially rectangular base plate 11 and terminal plates 30 are arranged substantially side by side along the width direction WD of the base plate 11. In this context, the width direction WD is substantially normal to the forward and backward directions FBD. A side plate 12 projects from the outer peripheral edge of the base plate 11 to surround the base plate 11. Partition walls 13 project at specified positions on the base plate 11 to at least partly separate the adjacent terminal plates 30, as shown in FIG. 1. A long rectangular opening 14 is formed at one edge of the base plate 11, and the leading ends of the terminal plates 30 are in the opening 14. Leads 60 connected with positive and negative electrodes of the solar battery module 90 are introduced into the respective openings 14 of the base plate 11 as shown in FIG. 3 and are connectable with the leading ends of the terminal plates 30 by soldering, welding, press-fitting or the like.

Positioning projections 15 project from the upper surface 11IS of the base plate 11 in correspondence with the respective terminal plates 30 and are engageable with respective positioning holes 31 of the terminal plates 30. Resiliently deformable locks 16 project at the opposite outer sides of each positioning projection 15. The locks 16 engage the opposite lateral edges of the terminal plate 30 in the process of mounting the terminal plate 30. Thus, the locks 16 deform away from the terminal plate 30 to widen the spacing therebetween. The locks 16 restore to press the opposite lateral edges of the terminal plate 30 substantially from above to prevent the terminal plate 30 from moving up and away from the base plate 11 upward.

Positioning walls 18 are provided on the upper surface 11IS of the base plate 11 for positioning the terminal plates 30. Each positioning wall 18 extends substantially along the width direction WD of the corresponding terminal plate 30, and a receiving groove (not shown) is formed at the base end of the positioning wall 18 for receiving the rear end of the terminal plate 30. The terminal plate 30 initially is aligned oblique to the base plate 11, and the rear end of the terminal plate 30 is inserted into the receiving groove. The front end of the terminal plate 30 then is moved down to engage the positioning hole 31 with the positioning projection 15.

Notches 17 are formed at the opposite ends of the rear side of the side plate 12, and cables 80 for external connection are inserted into the notches from above. Cable pressing members 20 are mounted to fix the cables 80 and are substantially flush with the side plate 12.

Each terminal plate 30 is formed into a short strip or band, for example, by cutting, stamping or pressing an electrically conductive metal plate. Four terminal plates 30 are arranged substantially side by side in a substantially middle part of the base plate 11 with respect to the forward and backward directions FBD. The cables 80 for external connection are arranged at the opposite ends of the base plate 11. Cores 81 are exposed at ends of the cables 80 by stripping insulation coatings 82, and barrels 32 at the ends of the terminal plates 30 are crimped, bent or folded into connection with the cores 81 to connect the cables 80 and the terminal plates 30. Of course, the connecting portions may be connected with the respective cables 80 in a different manner, such as by soldering, welding, press-fitting, insulation displacement, clamping, screwing or the like. It also should be noted that connectors (not shown) are connected with the other ends of the cables 80.

Front and rear parts of the terminal plates 30 that are connected with the cables 80 are offset along the width direction WD so that the front and rear parts align with the lead 60 and the cable 80, respectively. The partition walls 13 extend substantially along the opposite lateral edges of the terminal plates 30 and the cables 80. An insulating resin is filled at least partly into a space defined by the partition walls 13 for insulating the terminal plates 30 and the cables 80 inside the partition walls 13. Thus, less insulating resin is used than if the insulating resin is filled into the entire box main body 10.

Figure 2:
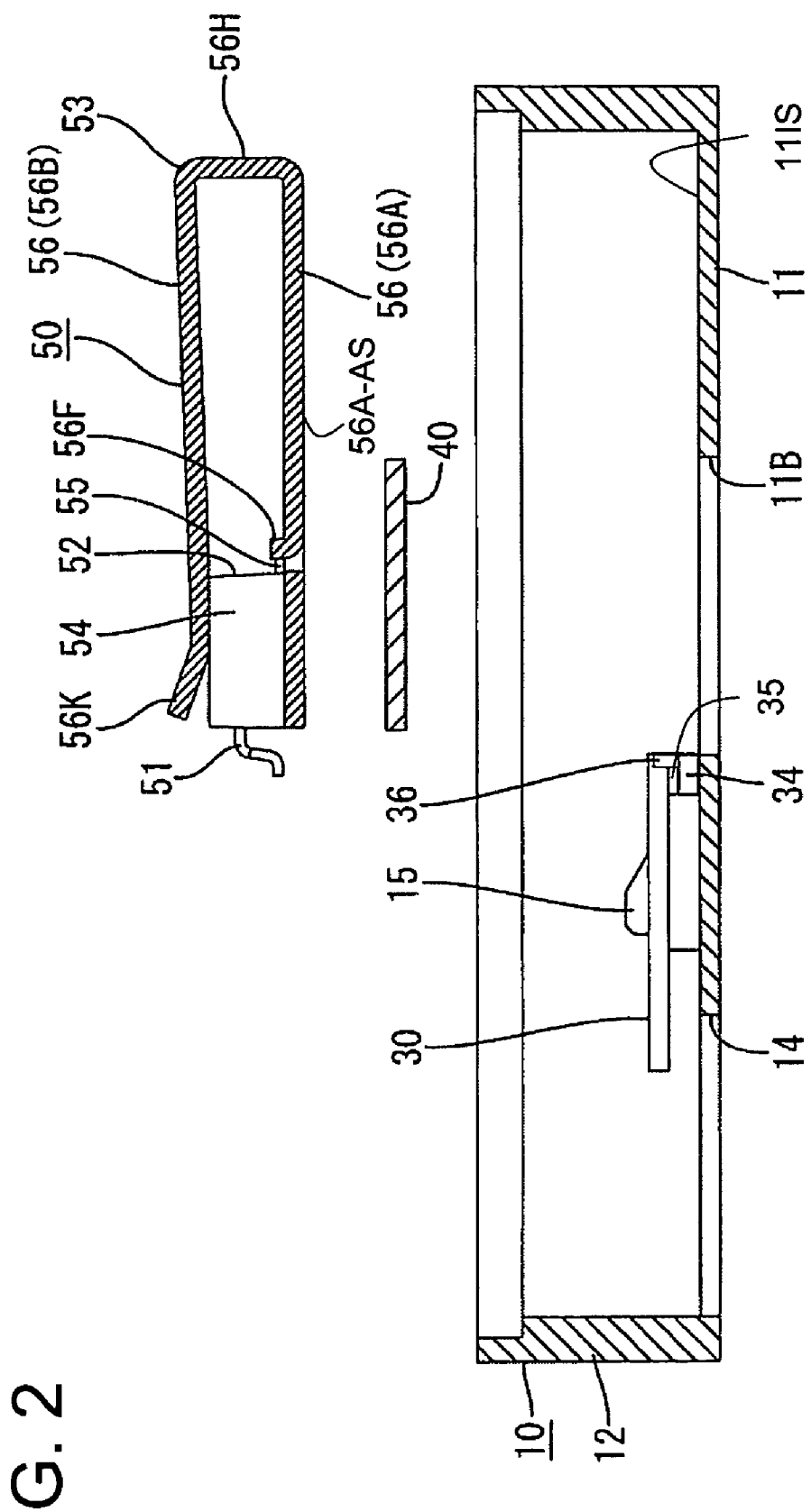
FIG. 2 is an exploded section showing the box main body, a rectifying-device unit and a heat discharging sheet.

The terminal plates 30 not connected with the cables 80 are arranged between the terminal plates 30 that are connected with the cables 80 in a substantially middle part of the upper surface 11IS of the base plate 11. Each of these terminal plates 30 is engaged with the corresponding positioning wall 18 and positioning projection 15 on the base plate 11 at opposite ends with respect to forward and backward directions FBD to prevent loose movements of the terminal plates 30 in plane directions. Attachments 34 bulge out sideways from the terminal plates 30 and have upper arrangement surfaces 34AS that connect with conductor pieces 51 of each rectifying-device unit 50 by soldering, welding, press-fitting, clamping or the like. As shown in FIG. 2, the attachment 34 is slightly below a main portion 35 to be connected with the lead 60 and corresponds to the arranged position of the conductor piece 51. Two protrusions 36 are provided on the arrangement surface 34AS of each attachment 34 for guiding the conductor piece 51 to a proper mount position.

Each rectifying device 50 spans between and connects adjacent terminal plates 30, and includes a bypass diode 52 for preventing an inverse current and a clip 53 for resiliently holding the bypass diode 52. Although three rectifying-device units 50 are illustrated, the number of the rectifying-device units 50 is determined in view of the capacity of the solar battery module 90 and can be changed.

Each bypass diode 52 has a rectangular parallelepiped resin molded portion 54, as shown in FIG. 2. Two conductor pieces 51 corresponding to a P-area (anode side) and an N-area (cathode side) project forward from a substantially middle part of the front end surface of the resin molded portion 54 and are connectable with the corresponding terminal plates 30 by soldering, welding, press-fitting or the like. A heat discharging plate 55 corresponding to the N-area (cathode side) has a part projecting back to the conductor pieces 51 from the bottom edge of the rear end of the resin molded portion 54 and the remaining part is exposed at the bottom of the resin molded portion 54. Each conductor piece 51 is bent into a substantially S shape after projecting substantially horizontally from one end surface. Thus, the leading end of each conductor piece 51 reaches substantially the same height as the bottom surface of the resin molded portion 54.

The clip 53 is formed by bending a plate that has good thermal transmission properties and good resiliency. For example, the clip 53 may be formed from an oxygen free copper or copper alloy that has been stamped or cut into a specified shape. Additionally, the clip 53 is substantially symmetrical with respect to an axis extending along forward and backward directions FBD to define a substantially U-shape with two supports 56. The supports 56 face each other and are spaced apart sufficiently to hold the bypass diode 52 resiliently between the leading ends of the supports 56. The lower support 56A is nearer the inner surface 11 IS of the base plate 11 and contacts the bottom surface of the bypass diode 52, i.e. at least partly with the heat discharging plate 55. The lower support 56A has a length along forward and backward directions FBD that is more than about twice, preferably more than about three times, most preferably about four times, the corresponding dimension of the bypass diode 52. The lower support 56A extends back until the rear end thereof substantially reaches the rear end of the base plate 11 when the rectifying-device unit 50 is mounted on the base plate 11. The lower support 56A has an arranging surface 56A-AS on or near the inner surface 11IS of the base plate 11 when the clip 53 is mounted properly into the main body 10.

The lower support 56A has a width along the width direction WD that is more than about 1.5 times, more preferably about twice the width of the bypass diode 52. A stopper 56F is formed by cutting and bending a substantially middle part of the lower support 56A and contacts the rear end of the heat discharging plate 55 to prevent backward movement of the bypass diode 52. As shown in FIG. 1, substantially U-shaped notches 56G are formed at opposite lateral edges of the lower support 56A. The engageable portions 19 that project from the base plate 11 contact edges of the notches 56G and deform resiliently in the process of mounting the rectifying-device unit 50 onto the base plate 11. The engageable portions 19 restore and contact the upper surfaces near the edges of the notches 56G as the lower support 56A is placed on the base plate 11. As a result, upward movements of the rectifying-device unit 50 away from the base plate 11 are prevented.

An intermediate coupling 56H projects up at an intermediate part of the rear end of the lower support 56A, and the upper support 56B extends forward from the upper end of the intermediate coupling 56H for contacting the upper surface of the bypass diode 52. The intermediate coupling 56H and the upper support 56B are slightly narrower than the bypass diode 52. Thus, the upper support 56B is narrower than the lower support 56A. Further, the upper support 56B slopes down from the intermediate coupling 56H towards the front for contacting the downwardly sloped part of the bypass diode 52. The upper support 56B then slopes up and away from the lower support 56A to define a guide 56K for guiding the bypass diode 52. The minimum spacing between the upper support 56B and the lower support 56A in an undeformed state is slightly less than the corresponding height of the bypass diode 52.

Auxiliary positioning walls (not shown) project at the rear end of the base plate 11, and the opposite sides of the rear end of the lower support 56A can be fit into receiving grooves at the base ends of the auxiliary positioning walls. The rectifying-device unit 50 is held at an oblique posture for mounting onto the base plate 11 to bring the opposite sides of the rear end of the lower support 56A into contact with the bottom surface of the receiving groove. The rectifying-device unit 50 then is inclined to bring the front end of the lower support 56A down towards the base plate 11 to place the two conductor pieces 51 on the corresponding terminal plates 30 for connection.

A heat discharging sheet 40 is attached to the bottom surface of each rectifying-device unit 50 and on the base plate 11 for discharging heat generated by the bypass diode 52. More specifically, the heat discharging sheet 40 is attached to a portion of the lower surface of the lower support 56A located right below or adjacent the heat discharging plate 55 of the bypass diode 52, so that heat from the bypass diode 52 can escape efficiently.

The heat discharging sheet 40 is formed by applying a heat discharging adhesive having a high heat discharging property to the outer or lower surface of the lower support 56A. Alternatively, the heat discharging sheet 40 may be formed by placing a flexible heat discharging layer and an adhesive layer at least partly over one another (see, for example, Japanese Unexamined Patent Publication No. 2004-200199 which is incorporated herein by reference). The heat discharging sheet 40 may be co-molded, adhered, laminated, painted, deposited or the like on the support. A commercially available product can be used as such.

Through holes 11B are formed in the base plate 11 and form parts of heat discharging paths from the heat discharging sheets 40. The heat discharging sheets 40 are in the through holes 11B and heat discharging surfaces 40A of the heat discharging sheets 40 are exposed to the outside of the solar battery module 90. Thus, heat from the heat discharging surfaces 40A of the heat discharging sheets 40 is received by heat receiving surfaces 90A of the solar battery module 90 at positions substantially opposite the heat discharging surfaces 40A, and the heat is discharged to the entire solar battery module 90 from the heat receiving surfaces 90A. An air layer is between the heat discharging surface 40A of the heat discharging sheet 40 and the heat receiving surface 90A of the solar battery module 90 in the shown case. However, a transparent resin layer 95 may be adhered to the underside of the base plate 11 instead of the air layer.

The barrels 32 of the terminal plates 30 are connected with the cores 81 exposed at the ends of the corresponding cables 80 to connect the terminal plates 30 and the cables 80. The terminal plates 30 then are placed on the base plate 11. As a result, the positioning projections 15 on the base plate 11 enter the positioning holes 31 of the terminal plates 30 to position the terminal plates 30. The locks 16 engage the terminal plates 30 to prevent upward movement of the terminal plates 30 away from the base plate 11. The cable pressing members 20 then are mounted from above and at least partly cover the cables 80 to fix the cables 80 onto the base plate 11. The rear ends of the terminal plates 30 that are not connected with the cables 80 are inserted into the receiving grooves of the corresponding positioning walls 18.

The bypass diode 52 is fit into an opening of each clip 53 to squeeze the bypass diode 52 resiliently between the leading ends of the supports 56 and to form at least part of the rectifying-device unit 50. The heat discharging sheet 40 then is adhered or otherwise mounted to the lower arranging surface 56A-AS of the lower support 56A of each rectifying-device unit 50. Subsequently, the opposite sides of the rear end of each lower support 56A are inserted into the receiving groove of the corresponding positioning wall 18 and/or auxiliary positioning wall. Each pair of conductor pieces 51 is placed on the attachment portions 34 of the corresponding terminal plate 30 and is soldered or otherwise connected electrically to the attachment portions 30. Further, the resilient engagement of the lower supports 56A with the engageable portions 19 prevents upward movements of the lower supports 56A or the rectifying-device units 50 with respect to the base plate 11.

The box main body 10 then is adhered to the underside of the solar battery module 90 with an adhesive that preferably comprises a transparent resin. In this way, the resin layer 95 is formed between the base plate 11 and the solar battery module 90, as shown in FIG. 3. The leads 60 connected with the electrodes of the solar battery module 90 are drawn into the box main body 10 through the opening 14 of the base plate 11 in the mounting process and are connected with the leading ends of the terminal plates 30 preferably by soldering. The insulating resin, such as a silicone resin, then is filled onto the ends of the terminal plates 30 and the cables 80 inside the partition walls 13, and the cover 70 is mounted to close the box main body 10. Thus, the insulating resin achieves an airtight seal of the crimp-connected parts and the solder-connected parts. Further, the rear surface of the cover 70 presses the cable pressing members 20 against the base plate 11 as the cover 70 is mounted to prevent upward movements of the cable pressing members 20.

Heat generated by the bypass diodes 52 is transmitted to the heat discharging sheets 40 via the clips 53 and is absorbed by the heat discharging sheets 40. The heat then is discharged from the heat discharging surfaces 40A to the outside, and is received by the heat receiving surfaces 90A of the solar battery module 90. Accordingly, the heat does not remain in the bypass diodes 52 and the diode function of the bypass diodes 52 is not impaired.

The heat receiving surfaces 90A of the solar battery module 90 are spaced from the heat discharging surfaces 40A of the heat discharging sheet 40 only by the thickness of the adhesive or resin layer 95. Thus, a rate of reduction in the heat discharging efficiency can be held down.

The invention is not limited to the above described and illustrated embodiment. For example, the following embodiments are also embraced by the technical scope of the present invention as defined by the claims. Beside the following embodiments, various changes can be made without departing from the scope and spirit of the present invention as defined by the claims.

The rectifying device of the foregoing embodiment is constructed as the rectifying-device unit including the clip. However, the rectifying device may include only the bypass diode. Further, the bypass diode is not limited to the resin-sealed package type, and may be of the mold-less type in which a substantially bare chip diode is held between a pair of conductor plates.

The heat discharging sheet is attached only to the heat discharging surface of the rectifying-device unit in the foregoing embodiment. However, the heat discharging sheet may also be attached to the heat receiving surface of the solar battery module according to the present invention.

The heat discharging sheet is attached to the bottom surface of the rectifying device and the heat receiving surface is provided on the solar battery module in the foregoing embodiment. However, the heat discharging sheet may be attached to the upper surface of the rectifying device and the heat receiving surface may be on the cover according to the invention.

What is claimed is:

1. A terminal box for mounting on a surface of an electric or electronic device, comprising a base plate having an outer surface facing outwardly on the terminal box and an opposite inner surface facing into the terminal box, at least one through hole formed through the base plate between the outer surface and the inner surface, terminal plates arranged on the inner surface of the base plate for electrically connecting positive and negative electrodes of an electric or electronic module, at least one rectifying device spanning between the terminal plates for bypass at a time of an inverse load, at least one heat discharging element attached to the rectifying device and disposed at least partly in the through hole in the base plate, the heat discharging element having a heat discharging surface facing outwardly from the terminal box at the through hole for discharging heat generated by the rectifying device, and a substantially transparent resin layer provided on at least part of the outer surface of the base plate and projecting beyond the outer surface of the base plate farther than the heat discharging surface of the heat discharging element, whereby the resin layer can be mounted on the surface of the electronic or electronic device with the heat discharging surface of the heat discharging element being opposed to and spaced from the electric or electronic device.

2. The terminal box of claim 1, wherein the heat discharging element comprises a heat discharging sheet attached to the rectifying device.

3. A terminal box for an electric or an electronic device, comprising:
a base plate, terminal plates arranged on the base plate for electrically connecting positive and negative electrodes of an electric or electronic module, at least one rectifying device spanning between the terminal plates for bypass at a time of an inverse load, at least one heat discharging element attached to the rectifying device for discharging heat generated by the rectifying device, wherein partition walls are formed on the base plate and extend substantially along edges of the terminal plates and cables for connection of the terminal plates with the electric or electronic module.

4. The terminal box of claim 3, wherein an insulating resin is filled at least partly into a space defined by the partition walls and onto the terminal plates and the cables inside the partition walls.

5. A terminal box for an electric or an electronic device, comprising: a base plate, terminal plates arranged on the base plate for electrically connecting positive and negative electrodes of an electric or an electronic module, at least one rectifying device spanning between the terminal plates for bypass at a time of an inverse load, the rectifying device including a clip for mounting the rectifying device on the base plate and at least one heat discharging element attached to the rectifying device for discharging heat generated by the rectifying device.

6. The terminal box of claim 5, wherein the clip has a first support with an arranging surface arranged on the base plate, the heat discharging element being attached to a portion of the arranging surface.

7. The terminal box of claim 6, wherein the arranging surface of the first support is adjacent to a heat discharging plate of the rectifying device.

8. The terminal box of claim 6, wherein the clip has a second support and an intermediate coupling extending between and joining the first and second supports, a guide diverging at a leading end of the second support for guiding the rectifying device into engagement with the clip.

9. The terminal box of claim 5, wherein the clip comprises a stopper disposed for engaging the rectifying device and preventing relative movement of the rectifying device.

10. A method of assembling a terminal box for an electric or electronic device, comprising:

provide a plurality of terminal plates for electrically connecting positive and negative electrodes of an electric or electronic module;

arranging the terminal plates on an inner surface of a base plate of the terminal box;

providing at least one rectifying device that spans between two of the terminal plates for bypass during an inverse load;

attaching at least one heat discharging element to the rectifying device at a position aligned with a through hole in the base plate for discharging heat generated by the rectifying device; and providing a substantially transparent resin layer on an outer surface of the base plate, whereby the resin layer can be disposed on a surface of the electric or electronic device with the heat discharging element opposed to the electric or electronic device.

* * * * *